(12) United States Patent
Chu

(10) Patent No.: US 7,758,229 B2
(45) Date of Patent: Jul. 20, 2010

(54) LIGHT SOURCE ASSEMBLY AND BACKLIGHT MODULE HAVING THE SAME

(75) Inventor: Yuan-Fa Chu, Miao-Li Hsien (TW)

(73) Assignee: Foxsemicon Integrated Technology, Inc., Chu-Nan, Miao-Li Hsien (TW)

( * ) Notice: Subject to any disclaimer, the term of this patent is extended or adjusted under 35 U.S.C. 154(b) by 251 days.

(21) Appl. No.: 11/972,501

(22) Filed: Jan. 10, 2008

(65) Prior Publication Data
US 2008/0298067 A1    Dec. 4, 2008

(30) Foreign Application Priority Data
Jun. 1, 2007  (CN) .......................... 2007 1 0074806

(51) Int. Cl.
*F21V 7/04*    (2006.01)
(52) U.S. Cl. ...................... 362/614; 362/606; 362/608; 362/612; 362/629
(58) Field of Classification Search ......... 362/606–608, 362/612, 311.02, 614; 257/98
See application file for complete search history.

(56) References Cited

U.S. PATENT DOCUMENTS

| 6,036,328 | A  | * | 3/2000 | Ohtsuki et al. ............... 362/612 |
| 7,481,558 | B2 | * | 1/2009 | Lin et al. ..................... 362/346 |
| 7,534,025 | B2 | * | 5/2009 | Harbers et al. .............. 362/612 |
| 2004/0080926 | A1 |  | 4/2004 | Chen et al. |
| 2005/0107499 | A1 | * | 5/2005 | Georgeau et al. .............. 524/59 |
| 2006/0072339 | A1 | * | 4/2006 | Li et al. ....................... 362/608 |
| 2007/0081360 | A1 |  | 4/2007 | Bailey et al. |

* cited by examiner

*Primary Examiner*—Stephen F Husar
*Assistant Examiner*—James W Cranson
(74) *Attorney, Agent, or Firm*—Jeffrey T. Knapp

(57) ABSTRACT

The present invention relates to a light source assembly and a backlight module including the same. The light source assembly (10) includes a light source (12) and a light guide plate (16). The light source (12) includes a light-emitting layer (122). The light source assembly (10) further includes a transparent filling layer (14) is interposed between the light source (12) and the light guide plate (16). The light source assembly (10) can reduce reflection and refraction loss when the light beam enters the light guide plate (16).

15 Claims, 3 Drawing Sheets

LIGHT SOURCE ASSEMBLY AND BACKLIGHT MODULE HAVING THE SAME

BACKGROUND

1. Field of the Invention

The invention generally relates to light source assembly, and particularly to a light source assembly with an improved efficiency of light utilization.

2. Description of Related Art

Currently, backlight modules are widely employed in LCD displays. A backlight module generally includes a light source and a light guide plate. The light source can be, for example, light-emitting diodes (LEDs), and cold cathode fluorescent lamps (CCFL).

The light source is usually mounted in a side or bottom of the light guide plate. However, an air gap exists between the light source and the light guide plate. The refractive index of the light guide plate of the light source is greater than the air. As a consequence, light entering the light guide plate is compromised due to reflection and refraction. In the case of reflection, the light is wasted. In the case of refraction, the light influences the distributing of the light rays. For solid-state lighting, the total internal reflection of the inside of the light source influences the efficiency of the light.

In order to solve the above mentioned problem, the light guide plate is in direct contact with the light source. However, the material of the light guide plate and the bezel of the light source both are solid material, therefore a plurality of small gaps may exist in the interface, however, and the plurality of small gaps may cause interference.

What is needed, therefore, is a light source assembly with reduced reflection and refraction loss while having a controllable light emission.

SUMMARY

A light source assembly is provided. In one present embodiment, the light source assembly includes at least one light source, at least one light guide plate and a transparent filling layer. The at least one light source has a light-emitting layer. The transparent filling layer is interposed between the light-source and the light guide plate. The light source assembly can reduce reflection and refraction loss when the light beam enters the light guide plate.

Advantages and novel features of the present light source assembly will become more apparent from the following detailed description of preferred embodiments when taken in conjunction with the accompanying drawings.

BRIEF DESCRIPTION OF THE DRAWINGS

The components in the drawing are not necessarily drawn to scale, the emphasis instead being placed upon clearly illustrating the principles of the present invention.

Corresponding reference characters indicate corresponding parts. The exemplifications set out herein illustrate at least one preferred embodiment of the present light source assembly, in one form, and such exemplifications are not to be construed as limiting the scope of the invention in any manner.

DETAILED DESCRIPTION OF THE EMBODIMENTS

Reference will now be made to the drawings to describe embodiments of the present light source assembly in detail.

Figure 1:
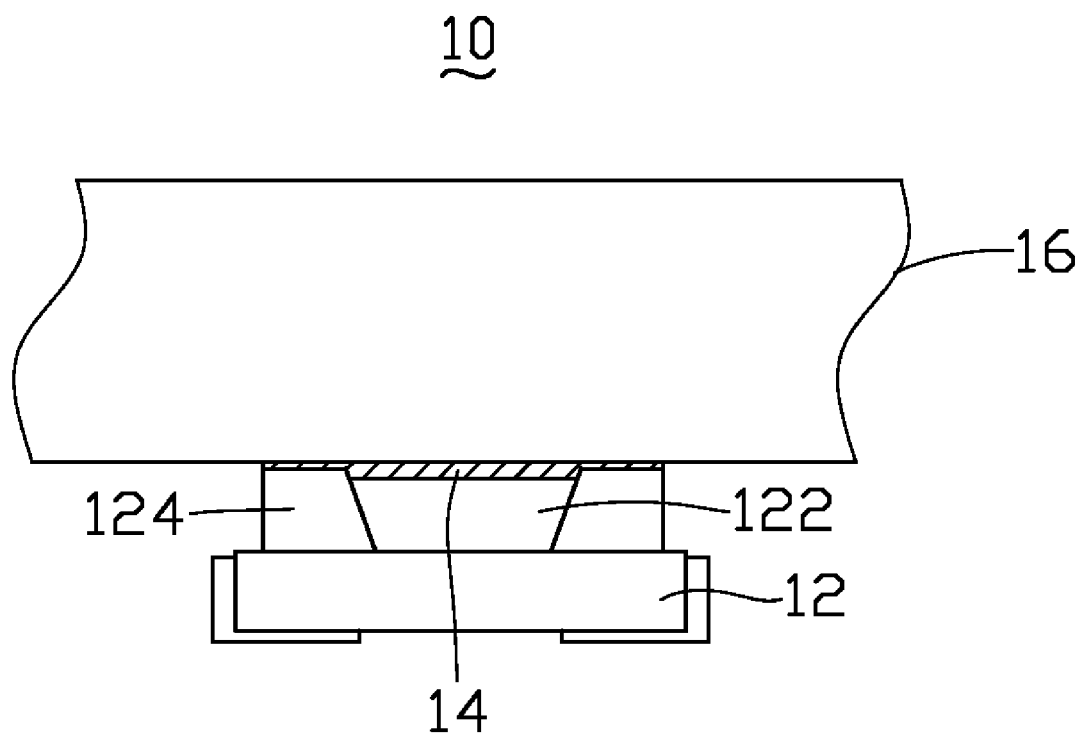
FIG. 1 is a schematic view of a light source assembly with a transparent filling layer in accordance with a first embodiment of the present invention.

Referring to FIG. 1, a light source assembly 10 in accordance with a first embodiment, is shown. The light source assembly 10 includes a light source 12, a transparent filling layer 14 and a light guide plate 16. The light source 12 is a solid-state light source (e.g. LED). The light source 12 has a light-emitting layer 122 and a light-pervious cover 124. The light-pervious cover 124 is attached on the light emitting layer 122. The transparent filling layer 14 is interposed between the light source 12 and the light guide plate 16.

The light-emitting layer 122 may be an encapsulation enclosure of the light source 12 or a light-extracting structure of the encapsulation enclosure of the light source 12. The light-emitting layer 122 may be made of high transparency material such as glass, silicone, transparent silicone rubber and transparent polyurethane. The thickness of the transparent filling layer 14 may be just thick enough to be interposed between the light-pervious cover 124 and the light guide plate 16. The transparent filling layer 14 may be made of soft transparent material, such as silicone, transparent silicone rubber, thermoplastic polyurethane, polyvinyl chloride, and high viscous liquid such as organic silicone oil, higher alcohols and esters compounds. The carbon atom of the higher alcohols is greater than five. The light guide plate 16 may be transparent plate or wedge plate. The material of the light guide plate 16 may be glass, polyacrylate and polymethacrylate.

The refractive index of the light-emitting layer $n_L$ is equal to or less than the refractive index of the transparent filling layer $n_F$, and the refractive index of the transparent filling layer $n_F$ is equal to or less than the refractive index of the light guide plate. Particularly, the refractive index of the light-emitting layer 122, the transparent filling layer 14 and the light guide plate 16 are substantially the same. Thus, the reflection and refraction loss are reduced when the light beam enters the light guide plate 16. If the refractive index of the light-emitting layer 122 and the transparent filling layer 14 and the light guide plate 16 are different, it is advantageous that, the refractive index of the transparent filling layer $n_F$ satisfies the following equation: $n_F = \sqrt{n_L \times n_G}$. Thus, the reflection and refraction loss can be reduced when the light beam enters the light guide plate 16. Preferably, a plurality of fluorescent powder may be mixed in the transparent filling layer 14. Thus, the light of the light-emitting layer 122 can stimulate the fluorescent powder when the light beam enters the transparent filling layer 14, thereby a large divergent angle and improved light uniformity can be achieved.

It is understood that, during manufacturing of the light source assembly 10, the transparent filling layer 14 may be in contact with the light-emitting layer 122 prior to assembling of the light source assembly 10. In another embodiment, the transparent filling layer 14 may be in contact with the light guide plate 16 prior to assembling the light source assembly 10. Still in another embodiment, the transparent filling layer 14 may be divided into a first portion and a second portion. The first portion is coming into contact with the light-pervious cover 124 of the light source 12, and the second portion is coming into contact with the light guide plate 16. If the material of the transparent filling layer 14 and the light-pervious cover 124 are the same, the transparent filling layer 14 and the light-pervious cover 124 of the light source 12 may be integrally formed. When the light source 12 and the light guide plate 16 are assembled together, the transparent filling layer 14 is interposed between the light source 12 and the light guide plate 16.

As mentioned above, the transparent filling layer 14 is interposed between the light source 12 and the light guide plate 16 can reduce reflection and refraction loss when the light beam enters the light guide plate 16. In addition, a large divergent angle and improved light uniformity may be achieved. If the refractive index of the light-emitting layer 122, the transparent filling layer 14 and the light guide plate 16 are the same or similar, the advantages of the light source assembly are more significant.

Figure 2:
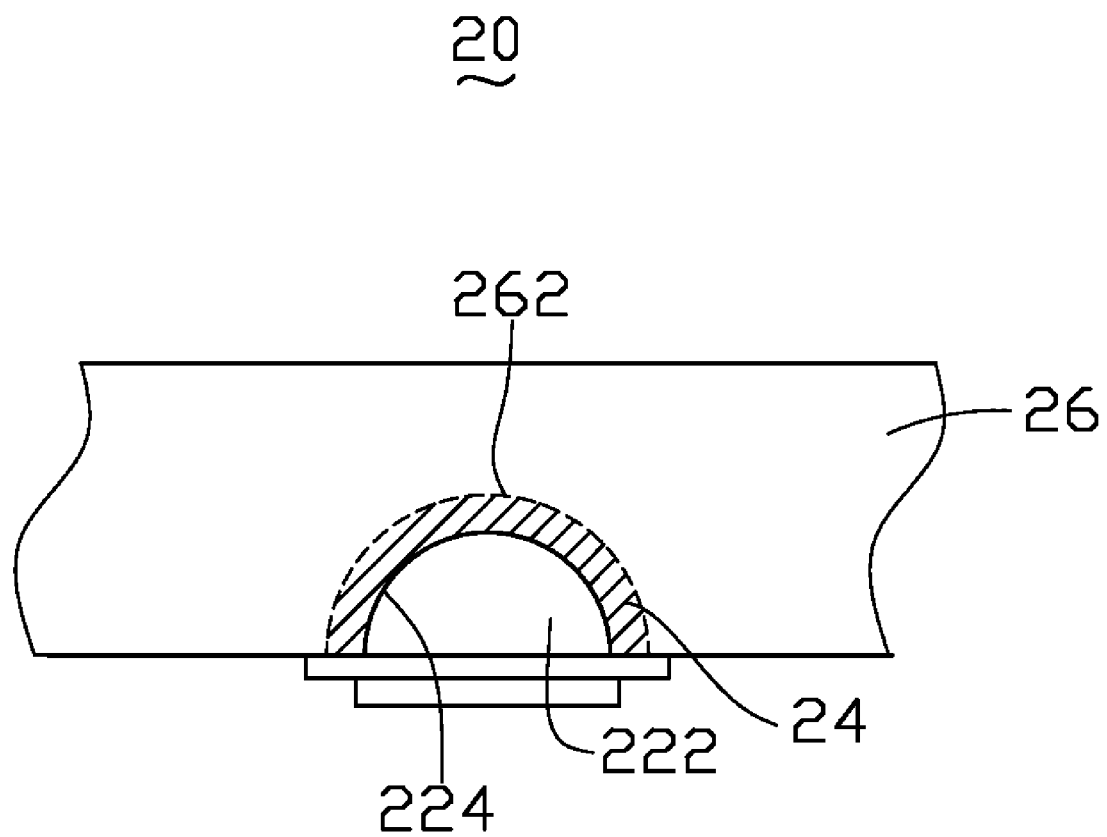
FIG. 2 is a schematic view of a light source assembly with a hemispherical convex structure of the light-emitting layer in accordance with a second embodiment of the second invention.

FIG. 2 illustrates a light source assembly 20 of a second embodiment. In this embodiment, the light-emitting layer 222 and the light-pervious cover 224 have a hemispherical convex structure. The light guide plate 26 has a hemispherical concave recess 262. The light-emitting layer 222 is accommodated in the concave recess 262. The transparent filling layer 24 is interposed between the light source 12 and the light guide plate 226. The hemispherical light-emitting layer 222 has a large divergent angle and improved distribution of the optical field. The light beam of the light-emitting layer 222 enters the light guide plate 26 with higher efficiency of utilization. In the present embodiment, the shape of the light-emitting layer 222 may be hemispherical, circle, rhombus and taper structure.

Figure 3:
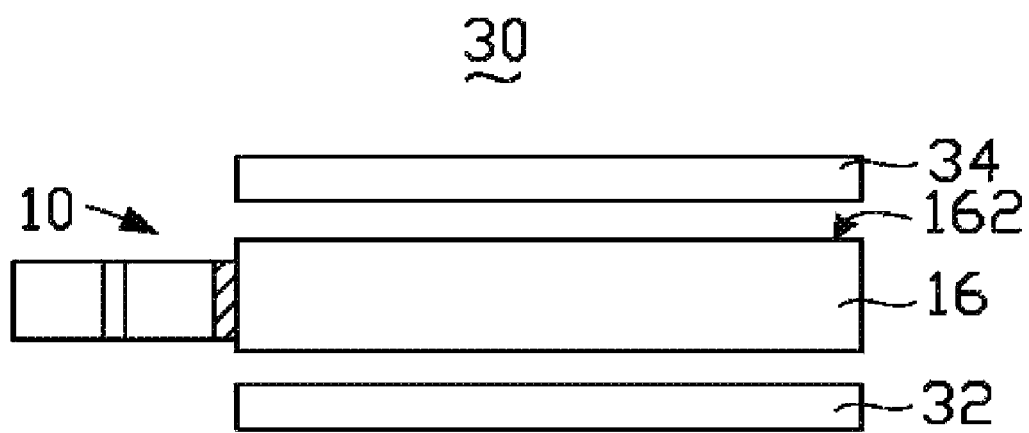
FIG. 3 is a schematic view of a light source assembly with a edge lighting backlight module in accordance with a third embodiment.

FIG. 3 illustrates an edge lighting backlight module 30 having a light source assembly 10, a reflective plate 32 and a light diffusing sheet 34. The light diffusing sheet 34 disposed on a light-extracting surface 162 of the light guide plate 16. The reflective plate 32 is disposed on an opposite side of the light guide plate 16. The reflective plate 32 is configured for reflecting the light exiting from the light guide plate 16 back into the light guide plate 16. The light exiting the light guide plate 16 is enters the light diffusing sheet 34. The backlight module 30 may be an edge lighting backlight module or bottom lighting backlight module.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A light source assembly, comprising:
 a light source having a light-emitting layer and a light-pervious cover attached on the light emitting layer;
 a light guide plate; and
 a transparent filling layer interposed between the light source and the light guide plate, wherein the refractive index of the light emitting layer $n_L$ is less than the refractive index of the transparent filling layer $n_F$, and the refractive index of the transparent filling layer $n_F$ is less than the refractive index of the light guide plate $n_G$ and satisfies the following equation:

$$n_F = \sqrt{n_L \times n_G}.$$

2. The light source assembly as claimed in claim 1, wherein the transparent filling layer is in contact with the light guide plate.

3. The light source assembly as claimed in claim 1, wherein the transparent filling layer is in contact with the light-pervious cover of the light source.

4. The light source assembly as claimed in claim 1, wherein the transparent filling layer comprises a first portion and a second portion, the first portion coming into contact with the light-pervious cover of the light source, the second portion coming into contact with the light guide plate.

5. The light source assembly as claimed in claim 3, wherein the transparent filling layer is integrally formed with the light-pervious cover of the light source.

6. The light source assembly as claimed in claim 1, wherein the transparent filling layer contains a fluorescent powder therein.

7. The light source assembly as claimed in claim 1, wherein the transparent filling layer is made of a material selected from the group consisting of silicone, transparent silicone rubber, thermoplastic polyurethane, polyvinyl chloride, organic silicone oil, alcohols having a carbon atom number of greater than five, and esters having a carbon atom number of greater than five.

8. The light source assembly as claimed in claim 1, wherein the light-pervious cover of the light source has a convex shape or a concave structure.

9. The light source component as claimed in claim 1, wherein the light guide plate has a concave recess with the light source received therein.

10. A backlight module comprising:
 a light source assembly comprising:
  a light source having a light-emitting layer and a light-pervious cover attached on the light emitting layer;
  a light guide plate having a light emitting surface and a bottom surface opposite to the light emitting surface; and
  a transparent filling layer interposed between the light source and the light guide plate, wherein the refractive index of the light emitting layer $n_L$, is less than the refractive index of the transparent filling layer $n_F$, and the refractive index of the transparent filling layer $n_F$ is less than the refractive index of the light guide plate $n_G$ and satisfies the following equation:

$$n_F = \sqrt{n_L \times n_G}; \text{ and}$$

a light diffusing sheet arranged on a light-extracting surface of the light guide plate; and
 a reflective plate arranged on the bottom surface of the light guide plate.

11. The backlight module as claimed in claim 10, wherein the transparent filling layer is in contact with the light guide plate.

12. The backlight module as claimed in claim 10, wherein the transparent filling layer is in contact with the light-pervious cover of the light source.

13. The backlight module as claimed in claim 10, wherein the transparent filling layer comprises a first portion and a second portion, the first portion coming into contact with the light-pervious cover of the light source, the second portion coming into contact with the light guide plate.

14. The backlight module as claimed in claim 10, wherein the transparent filling layer contains fluorescent powder therein.

15. The backlight module as claimed in claim 12, wherein the transparent filling layer is comprised of a material selected from the group consisting of silicone, transparent silicone rubber, thermoplastic polyurethane, polyvinyl chloride, organic silicone oil, alcohols having a carbon atom number of greater than five, and esters having a carbon atom number of greater than five.

* * * * *